(12) United States Patent
Nixon et al.

(10) Patent No.: US 9,004,086 B2
(45) Date of Patent: Apr. 14, 2015

(54) METHODS AND APPARATUS FOR DISPLACING FLUIDS FROM SUBSTRATES USING SUPERCRITICAL CO2

(75) Inventors: Ronda K. Nixon, San Francisco, CA (US); Iqbal A. Shareef, Fremont, CA (US); Mark I. Wagner, Austin, TX (US); Robert McAndrew, Austin, TX (US); Tony Ray Kroeker, Georgetown, TX (US)

(73) Assignee: Lam Research Corporation, Fremont, CA (US)

( * ) Notice: Subject to any disclaimer, the term of this patent is extended or adjusted under 35 U.S.C. 154(b) by 800 days.

(21) Appl. No.: 12/939,896

(22) Filed: Nov. 4, 2010

(65) Prior Publication Data
US 2012/0111379 A1    May 10, 2012

(51) Int. Cl.
| | | |
|---|---|---|
| *B08B 3/12* | (2006.01) | |
| *B08B 6/00* | (2006.01) | |
| *B08B 7/00* | (2006.01) | |
| *H01L 21/67* | (2006.01) | |
| *H01L 21/02* | (2006.01) | |

(52) U.S. Cl.
CPC ......... *B08B 7/0021* (2013.01); *H01L 21/02101* (2013.01); *H01L 21/67051* (2013.01); *H01L 21/6719* (2013.01)

(58) Field of Classification Search
CPC ....................................................... B08B 3/02
See application file for complete search history.

(56) References Cited

U.S. PATENT DOCUMENTS

| | | | |
|---|---|---|---|
| 5,316,591 A | 5/1994 | Chao et al. | |
| 2008/0264443 A1 | 10/2008 | Shrinivasan et al. | |

OTHER PUBLICATIONS

"International Search Report", Issued in PCT Application No. PCT/US2011/059336; Mailing Date: Mar. 21, 2012.
"Written Opinion", Issued in PCT Application No. PCT/US2011/059336 Mailing Date: Mar. 21, 2012.

*Primary Examiner* — Jason Ko
(74) *Attorney, Agent, or Firm* — Martine Penilla Group, LLP

(57) ABSTRACT

A processing chamber for post-wet-etch removing of drying fluid (DF) is disclosed. The chamber includes a chamber wall surrounding a processing volume and a plurality of nozzles disposed annularly about the processing volume and arranged into a set of nozzle rows that includes at least one nozzle row. The chamber also includes a plenum and a set of manifolds coupled to the plurality of nozzles to deliver the supercritical $CO_2$ to the plurality of nozzles. Each nozzle has a nozzle outlet directed toward an interior portion of the processing volume and the nozzles are configured to flow the supercritical $CO_2$ toward the substrates in a manner that minimizes recirculation loops and vortices.

15 Claims, 4 Drawing Sheets

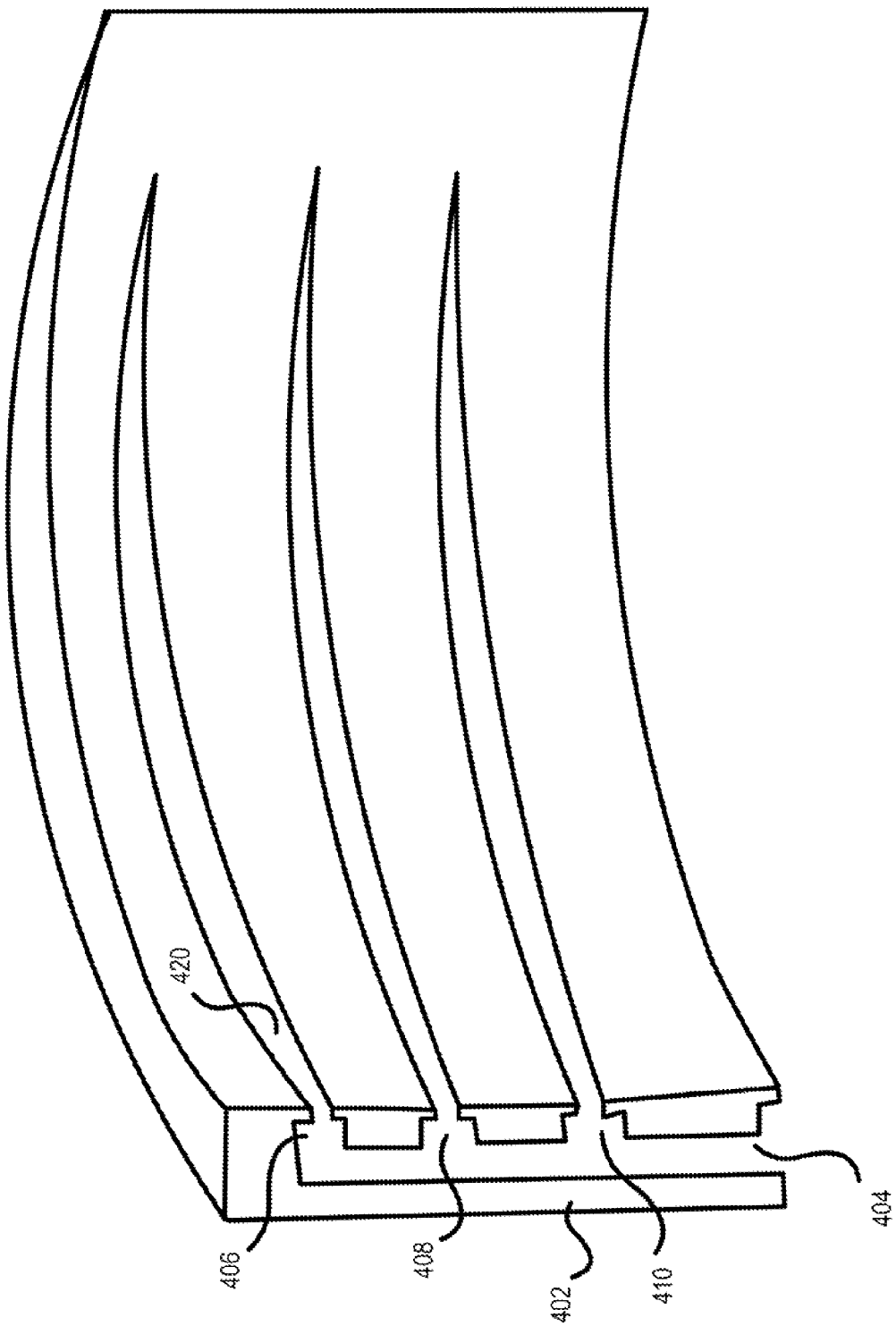

US 9,004,086 B2

METHODS AND APPARATUS FOR DISPLACING FLUIDS FROM SUBSTRATES USING SUPERCRITICAL CO2

BACKGROUND OF THE INVENTION

The production of semiconductor products often requires wet etching or some other form of wet processing of substrates that involves exposing the substrates to an aqueous-based liquid. After wet processing, the processing fluid and/or any aqueous-based rinsing fluid that remains on the surface of the substrate typically needs to be removed in order to prepare the substrate for the next processing step.

Generally speaking, the wet processing fluid and/or rinsing fluid may be removed by saturating the substrate with a drying fluid (DF) to displace the wet processing fluid. The drying fluid may be alcohol-based, for example, and may include surfactants and/or other adjuncts to maximize displacement efficiency. In order to avoid collapse of fragile structures on the substrate due to capillary forces, additional post-wet-processing step(s) may be performed to dry the substrate in a satisfactory manner.

As semiconductor features become smaller and smaller to accommodate higher device density requirements, there is a critical need for DF removal techniques that will prevent collapse of fragile structures and can satisfactorily dry out the wafer in as short a time as possible.

Supercritical $CO_2$ has been investigated and employed to facilitate DF removal and avoid collapse of fragile structures on the substrate. CO2 at supercritical conditions (Tc=31 C, Tp=1070 psi) has no surface tension to initiate collapse from capillary forces, and good solubility for several potential drying fluids.

Existing DF removal processes utilizing supercritical $CO_2$ have shown promising results toward preventing collapse of fragile structures, but often been time consuming, requiring a long time for DF agents and any other remaining residues to be satisfactorily removed. Existing DF removal processes using supercritical CO2 also require a large number of chamber turnovers to satisfactorily flush DF agents and any other remaining residues from the substrate surface, thereby undesirably increasing the total process time and volume of CO2 required, and reducing manufacturing productivity.

In view of the foregoing, improved supercritical CO2-based DF removal processes and apparatuses are desired.

BRIEF DESCRIPTION OF THE DRAWINGS

The present invention is illustrated by way of example, and not by way of limitation, in the figures of the accompanying drawings and in which like reference numerals refer to similar elements and in which:

FIG. 4 shows, in accordance with an embodiment of the present invention, an exploded side view of a portion of a processing chamber employing slits for supercritical $CO_2$ delivery.

DETAILED DESCRIPTION OF THE PREFERRED EMBODIMENTS

The present invention will now be described in detail with reference to a few embodiments thereof as illustrated in the accompanying drawings. In the following description, numerous specific details are set forth in order to provide a thorough understanding of the present invention. Many of the descriptions are relevant to a mini-batch drying process, in which multiple wafers are stacked above each other in the pressure chamber, but the principles described are applicable to a single wafer process as well. It will be apparent, however, to one skilled in the art, that the present invention may be practiced without some or all of these specific details. In other instances, well known process steps and/or structures have not been described in detail in order to not unnecessarily obscure the present invention.

The invention relates, in one or more embodiment, to an innovative substrate processing chamber design that employs either a plurality of nozzles or slits arranged such that supercritical $CO_2$ is flowed across the wafer surfaces with minimum recirculation loops and/or vortices. The innovative processing chamber design, in one or more embodiments, enables DF agents and any other remaining residues to be removed by the supercritical $CO_2$ in less time and with greater fluid rinsing efficiency.

The features and advantages of embodiments of the invention may be better understood with reference to the figures and discussions that follow.

Figure 1:
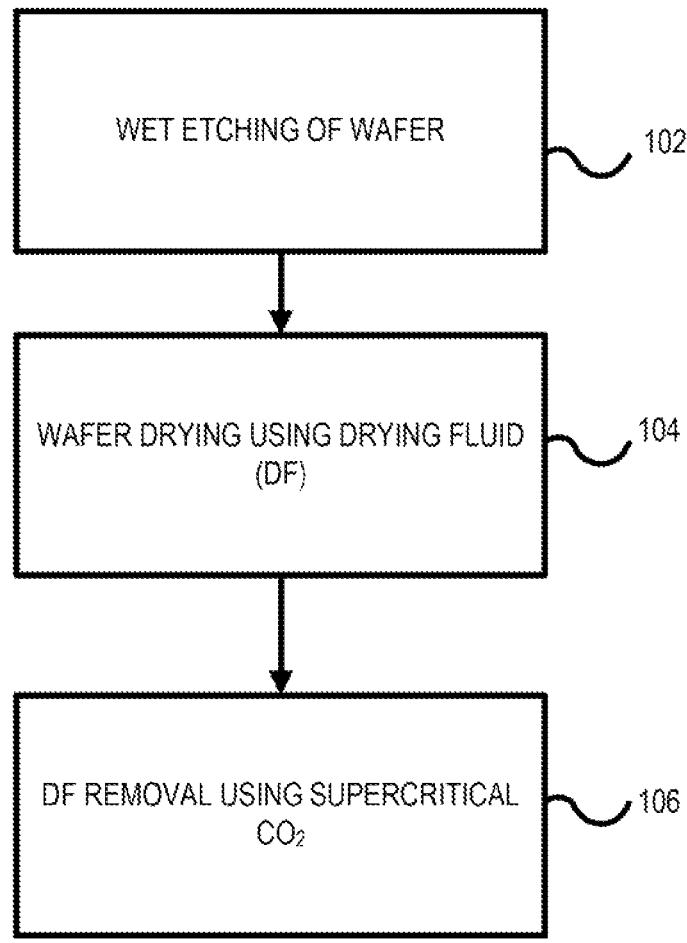
FIG. 1 shows, in accordance with an embodiment of the invention, an example overall view of the DF removal technique employing supercritical $CO_2$.

FIG. 1 shows, in accordance with an embodiment of the invention, an example overall view of the DF removal technique employing supercritical $CO_2$. In step 102, the substrate undergoes wet processing. The particulars of the wet processing step, such as wet etch, will not be described here, but step 102 may represent any wet process in which a substrate is required to be cleaned/dried in subsequent steps 104 and 106.

Step 104 represents the exposure of the post-wet-process substrate to a drying fluid to aid in the removal of the wet processing fluid and/or an aqueous-based rinse solution. Generally speaking, the drying fluid employed in step 104 may be, for example, alcohol-based although any suitable agent for displacing the wet processing fluid from the substrate may be employed.

Step 106 represents the DF removal step using supercritical $CO_2$ in accordance with aspects of the present invention. In step 106, the absence of surface tension and solvent properties of supercritical $CO_2$ are taken advantage of to remove the DF agent employed in step 104 as well as any etchant residue of step 102 that may be remaining on the substrate surface. In one or more embodiments, both steps 104 and 106 may be performed in the same innovative chamber (discussed below) to minimize substrate transfer and total processing time.

As the term is employed herein, supercritical $CO_2$ refers to $CO_2$ that is simultaneously above both its critical temperature (Tc=31.1 C) and critical pressure (Pc=1070 psi) For example, $CO_2$ will be in its supercritical state at 35 degree Celsius and 1,100 PSI. In one or more embodiments of the invention, the $CO_2$ pressure is between about 2,000 PSI and about 4,000 PSI. In an embodiment of the invention, the $CO_2$ pressure is about 3,000 PSI.

As will be discussed later herein, the supercritical $CO_2$ of step 106 is delivered to the substrate via innovative arrangements that substantially minimize vortices and recirculating loops to improve fluid rinsing efficiency and to reduce the time and CO2 volume required to satisfactorily remove the DF agent and any other remaining residue from the substrate.

To elaborate, vortices and recirculation loops represent stagnant areas of supercritical $CO_2$, wherein the fluid velocity of the supercritical $CO_2$ is substantially reduced. Since the goal is to replace as much of the DF agent with the supercritical $CO_2$ as quickly as possible, vortices and recirculation loops disadvantageously increase the chamber transient time, thereby increasing the time required and CO2 volume required to dry out the substrate with the supercritical $CO_2$.

Figure 2:
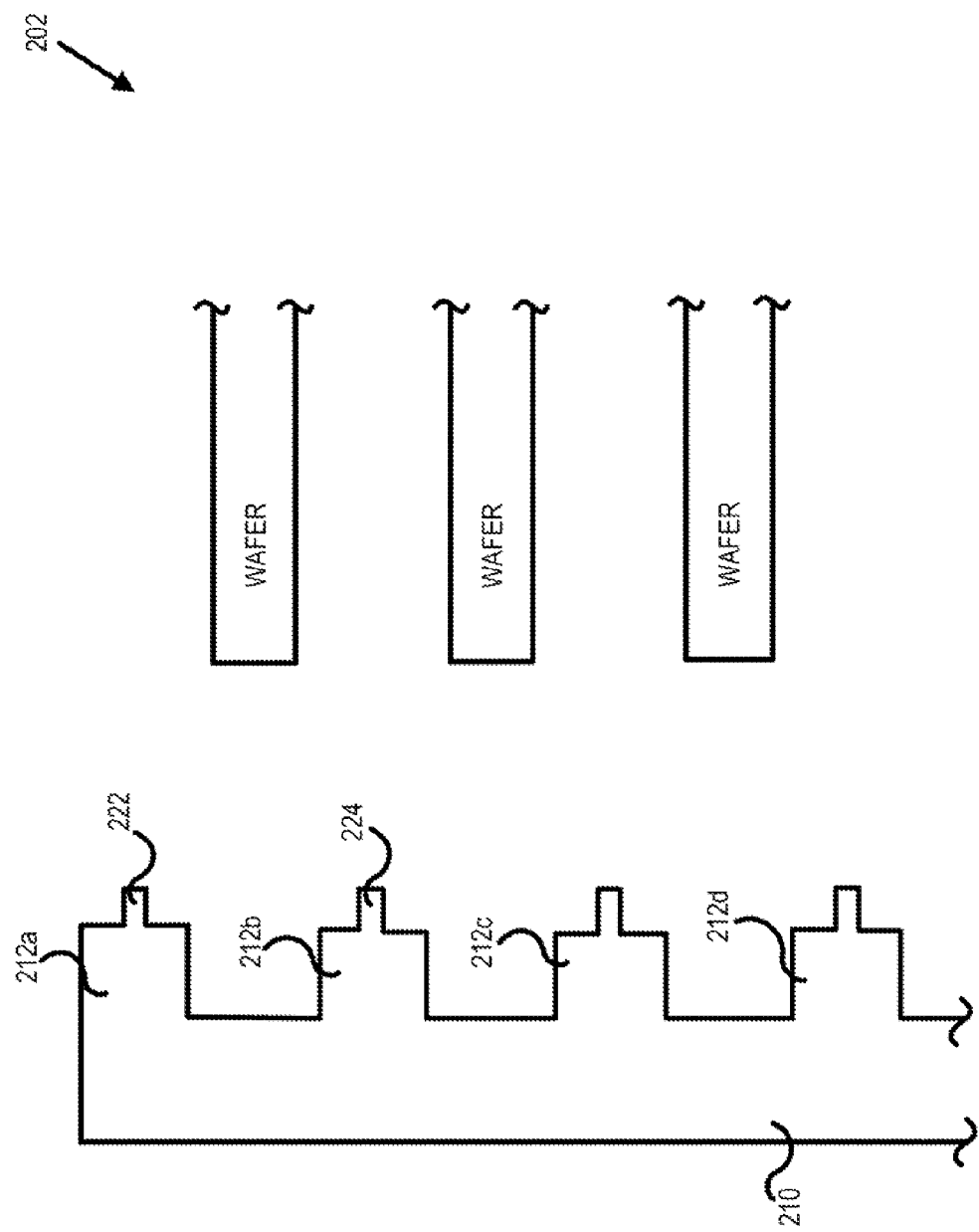
FIG. 2 shows, in accordance with an embodiment of the present invention, a side view of a chamber for efficiently removing drying fluid from substrate surfaces.

FIG. 2 shows, in accordance with an embodiment of the present invention, a side view of a chamber 202 that includes a vertical plenum 210 coupled with a plurality of horizontal manifolds 212, such as horizontal manifolds 212a, 212b, 212c, and 212d. Although only four horizontal manifolds are shown to facilitate discussion, any number of horizontal manifolds may be employed. As the term is employed herein, horizontal refers to the plane that is parallel to the substrate when the substrate is disposed within the processing volume of the processing chamber. On the other hand, vertical refers to the plane that is perpendicular to the horizontal plane.

Each of horizontal manifolds 212a, 212b, 212c and 212d is coupled to a plurality of nozzles disposed annularly about the processing volume within which the substrates are disposed for DF agent removal. Thus, there are rows of nozzles connected to the plurality of horizontal manifolds. Each nozzle is connected at one end to its respective horizontal manifold. For example, nozzle 222 is shown coupled to horizontal manifold 212a, while nozzle 224 is shown coupled to horizontal manifold 212b. At least one nozzle outlet is disposed at the other end of the nozzle and points inward toward the processing volume within which the substrates are disposed for DF agent removal.

It should be understood that the purpose of the rows of nozzles is to deliver supercritical $CO_2$ to the surfaces of substrates. In an embodiment, each row of nozzles is disposed such that a flow of supercritical $CO_2$ is directed in between a pair of substrates that are adjacent (but kept in a spaced-apart relationship). Thus, a single row of nozzles may be employed to clean two surfaces of the two adjacent-but-spaced-apart substrates. However, it may also be possible to dedicate one or more rows of nozzles to each substrate surface.

Supercritical $CO_2$ enters vertical plenum 210 and then flows to horizontal manifolds 212a, 212b, 212c and 212d. Each horizontal manifold serves as a conduit to allow supercritical $CO_2$ under pressure to flow into the row of nozzles connected to it. The nozzle and nozzle outlet sizes are dimensioned appropriately to enable steady streams of supercritical $CO_2$ to flow across substrate surfaces.

The supercritical $CO_2$ generally flows across the substrate surface from the nozzle outlets toward an exhaust port of the chamber (typically disposed on the other side of the nozzle). In one or more embodiments, some or all individual nozzles of a nozzle row may be disposed parallelly relative to one another. That is, some or all individual nozzles and/or nozzle outlets may be pointed, in one or more embodiments, such that the streams of supercritical $CO_2$ emitted by the nozzle outlets flow substantially parallelly across the substrate surface toward the exhaust port of the chamber while minimizing recalculating loops and vortices over the substrate surface. In another embodiment, some or all individual nozzles of a nozzle row may be disposed non-parallelly relative to one another such that the supercritical $CO_2$ may exit individual nozzle outlets at different angles relative to the center-of-horizontal-manifold-to-exhaust port vector.

In one or more embodiments some or all nozzles of a nozzle row may be pointed such that the supercritical $CO_2$ is directed in a plane that is parallel to the surface of the substrate or may be directed toward or away from the substrate surface. In one or more embodiments, the nozzle row may comprise different segments and/or the nozzles in a nozzle row may be non-planar when viewed in the direction from the substrate center toward the horizontal manifold. Given the system proposed herein, the optimization of the nozzle size, nozzle outlet size, the direction pointed by individual nozzles may be performed using empirical data to ensure that supercritical $CO_2$ is delivered with minimal vortices and recirculating loops.

Generally speaking, the total flow mass of supercritical $CO_2$ is governed approximately by Eq. 1 below.

$$TMF = (C) \times (N) \times (a) \qquad \text{Eq. 1}$$

where C is a constant that is specific to the supercritical $CO_2$ in the application, N is the number of nozzles, and (a) is the cross-section area of each nozzle. Total mass flow (TMF) is a product of C, N, and a.

Furthermore, it has been found that fluid rinsing efficiency tends to be improved when N is large and a is small for any given total mass flow. Considerations such as uniformity of supercritical $CO_2$ delivery by the nozzles arranged along a nozzle row needs to be taken into consideration. In an embodiment, the nozzle outlets may have different sizes or the horizontal manifolds may have non-uniform cross-sections from one end to another and/or from horizontal manifold to horizontal manifold to minimize pressure gradients in the nozzle outlet pressures among nozzle outlets of a particular nozzle row or from nozzle row to nozzle row. The goal is to deliver uniform supercritical $CO_2$ flow to/over/across all relevant areas of all substrate surfaces with minimal circulation loops or vortices and minimal differences from substrate surface to substrate surface in a batch.

Figure 3:
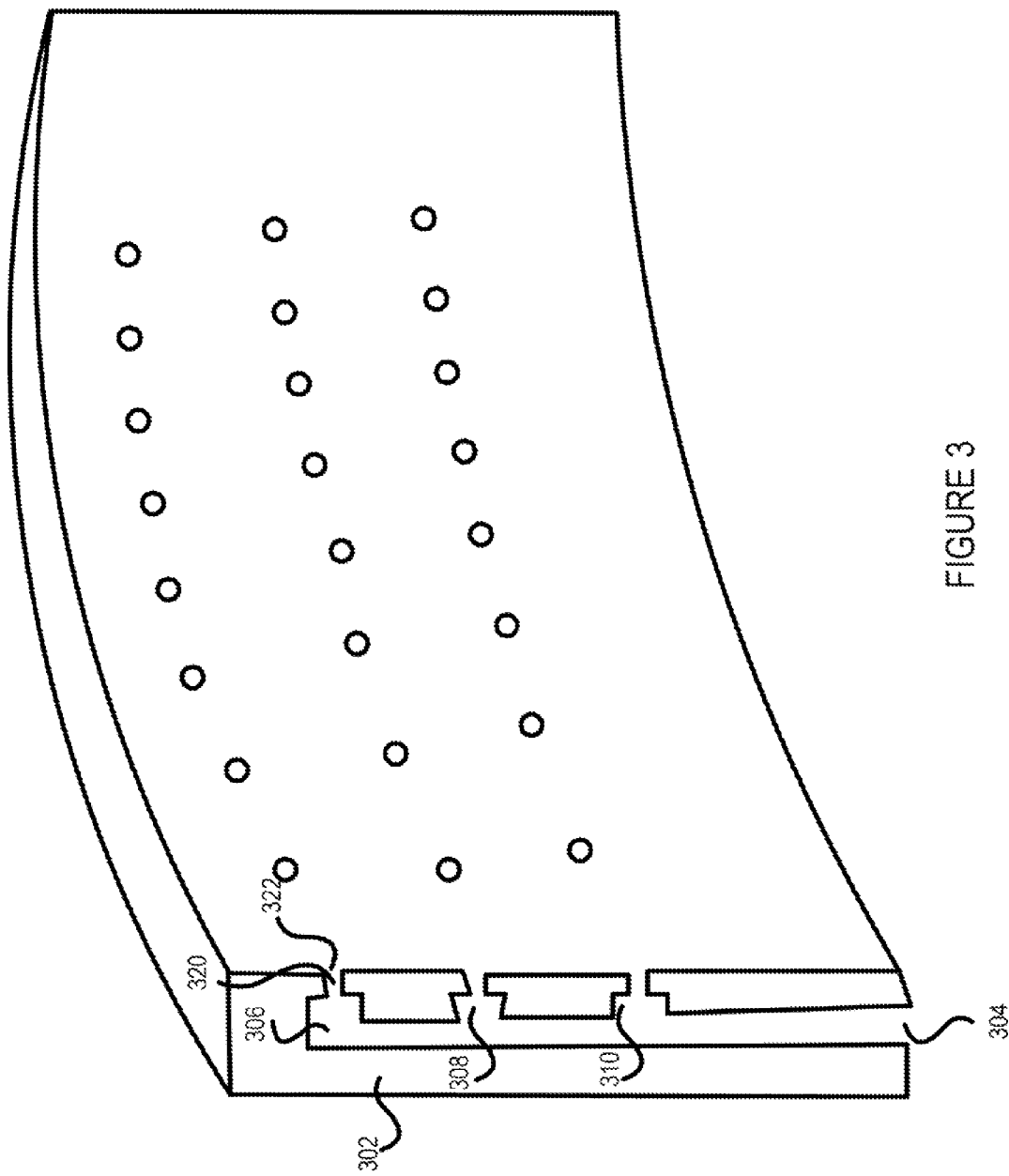
FIG. 3 shows, in accordance with an embodiment of the present invention, an exploded side view of a portion of a processing chamber employing nozzles for supercritical $CO_2$ delivery.

FIG. 3 shows, in accordance with an embodiment of the present invention, an exploded side view of a portion of a processing chamber, including a chamber wall 302, a vertical plenum 304, and a plurality of horizontal manifolds 306, 308, and 310. Each horizontal manifold, e.g., horizontal manifold 306, is coupled to a plurality of nozzles forming a nozzle row. For illustration purposes, nozzle 320 is shown coupled to horizontal manifold 306.

Nozzle 320 also includes a nozzle outlet 322 for ejecting supercritical $CO_2$ into the processing volume within which the set of substrates (either single substrate or a batch of substrates stacked parallelly in a spaced-apart relationship) is disposed. The nozzle outlets are sized to produce high impinging velocities and to reduce residence time of fluids. In one or more embodiments, the nozzle outlets are set flush with the interior surface of the chamber walls to simplify maintenance/cleaning and to reduce particulate contamination concerns.

As discussed earlier, improved DF agent flushing, reduced vortices, reduced recirculation loops, reduced DF agent removal time, and reduced CO2 usage may be achieved when the number of nozzles is large (see Eq. 1). In one or more embodiments, individual nozzles of a nozzle row are replaced by a slit that is configured to eject supercritical $CO_2$ as a sheet instead of as individual streams as in the case with nozzles. FIG. 4 shows, in accordance with an embodiment of the present invention, an exploded side view of a portion of a processing chamber employing slits for supercritical $CO_2$ delivery, including a chamber wall 402, a vertical plenum 404, and a plurality of horizontal manifolds 406, 408, and 410. Each horizontal manifold, e.g., horizontal manifold 406, has at least two openings: an opening toward the processing volume within which the set of substrates are disposed to function as a slit from which supercritical $CO_2$ can be ejected, and one or more openings that couple the horizontal manifold to the vertical plenum to permit supercritical $CO_2$ to flow from the vertical plenum to the horizontal manifold to be discharged toward the processing volume via the slit.

For illustration purposes, slit 420 is shown coupled to or formed integrally with horizontal manifold 406 for ejecting supercritical $CO_2$ into the processing volume within which the set of substrates (either single substrate or a batch of substrates stacked parallelly in a spaced-apart relationship) is disposed. In one or more embodiments, the slits are set flush with the interior surface of the chamber wall to simplify maintenance/cleaning and to reduce particulate contamination concerns.

When a slit is employed, the number of nozzles may be thought of as being infinite between two ends of the slits. As a result of a high N value (see Eq. 1), it has been found that the slit design tends to result in high fluid rinsing efficiency, low chamber turnovers, and reducing or eliminating vortices and recirculation loops in the supercritical $CO_2$ flow. In one or more embodiment, the slits may be about 0.005" wide although this is not an absolute requirement or a limitation of the present invention.

As can be appreciated from the foregoing, embodiments of the invention result in a highly uniform flow of supercritical $CO_2$ with low or no recirculation loops and/or vortices. The result is more efficient chamber turnovers and reduced time required for satisfactory DF flushing. In turn, the overall substrate process time may be reduced, leading to improved productivity for semiconductor manufacturers.

Having disclosed exemplary embodiments and the best mode, modifications and variations may be made to the disclosed embodiments while remaining within the subject and spirit of the invention as defined by the following claims.

What is claimed is:

1. A processing chamber for processing semiconductor substrates, said processing includes at least post-wet-processing removal of drying fluid (DF) from at least one substrate using supercritical CO2, comprising:
   a chamber wall surrounding a processing volume of the processing chamber;
   a plenum extending only vertically between a lower end and an upper end, the plenum defining the chamber wall for the processing chamber, the plenum having an interior channel between the lower end and the upper end, the plenum having a supply connection to the supercritical CO2 at the lower end of the plenum;
   a set of manifolds coupled to said plenum, the set of manifolds arranged in rows, wherein each row is spaced apart from another row along the chamber wall, and each row is disposed at a distinct vertical position along the chamber wall, and each of the set of manifolds having a horizontal manifold connection to the interior channel of the plenum;
   a set of nozzles, each nozzle being coupled to one of the horizontal manifolds and each nozzle having a nozzle output on an interior-facing surface of the plenum that is directed toward the processing volume of the processing chamber;
   wherein said nozzle outputs are disposed flush within the interior-facing surface of the plenum;
   wherein each of the nozzle outputs is oriented substantially perpendicular to said chamber wall.

2. The processing chamber of claim 1 further comprising, a substrate support structure configured to hold said at least one substrate parallel and in a spaced-apart relationship with respect to another substrate of said set of substrates, said substrate support structure positioning said at least one substrate and said another substrate of said set of substrates such that at least one of said rows of the set of manifolds is oriented between two of said set of substrates.

3. The processing chamber of claim 1 wherein said at least one substrate includes a plurality of substrates.

4. The processing chamber of claim 1 wherein said set of manifolds are disposed within said chamber wall.

5. The processing chamber of claim 1 wherein said set of nozzles are disposed within said chamber wall and disposed annularly about said processing volume.

6. The processing chamber of claim 5, wherein at least one row of manifolds spans only a portion of a circumference of said chamber wall.

7. The processing chamber of claim 1, wherein said set of manifolds is disposed within said chamber wall.

8. A processing chamber for processing substrates using supercritical CO2, comprising:
   a chamber wall surrounding a processing volume of the processing chamber, the processing volume configured for a substrate support for holding a plurality of substrates in a horizontal orientation relative to the chamber wall that is perpendicular to the horizontal orientation;
   a plenum extending only vertically between a lower end and an upper end within the chamber wall, an interior surface of the plenum facing the processing volume, the plenum having an interior channel that extends at least between the lower end and the upper end, the plenum having a supply connection at the lower end for receiving the supercritical CO2;
   a plurality of horizontal manifolds providing conduits to the interior channel of the plenum, the plurality of manifolds arranged in rows around the plenum, wherein each row is spaced at a distance apart from another row, and each row is oriented at a distinct vertical location of the plenum that substantially aligns between at least two of the substrates when present on the substrate support, the distance being at greater than a thickness of one of the substrates; and
   a plurality of nozzles, each nozzle being coupled to one of the plurality of horizontal manifolds;
   wherein and each nozzle has a nozzle output that is directed toward the processing volume of the processing chamber;
   wherein the surface of the plenum facing the processing volume is substantially planar and curved and includes each of nozzle outputs.

9. The processing chamber of claim 8, wherein each of the nozzle outputs is oriented substantially perpendicular to said chamber wall.

10. The processing chamber of claim 8, wherein the plurality of nozzles are defined as either discrete nozzles or as a slit nozzle.

11. A processing chamber, comprising:
    a chamber wall surrounding a processing volume of the processing chamber, the processing volume configured for a substrate support for holding a plurality of substrates in a horizontal orientation relative to the chamber wall that is perpendicular to the horizontal orientation;
    a plenum extending only vertically between a lower end and an upper end within the chamber wall, an outer surface of the plenum defining at least part of the chamber wall that faces the processing volume, the plenum having an interior channel that extends at least between the lower end and the upper end, the plenum having a supply connection lower-end for receiving supercritical CO2 when processing by said processing chamber;

a plurality of horizontal manifolds providing conduits to the interior channel of the plenum, the plurality of manifolds arranged in rows around the chamber wall, wherein each row is spaced at a distance apart from another row along the chamber wall, and each row is oriented at a distinct vertical location on the chamber wall that substantially aligns between at least two of the substrates when present on the substrate support; and a plurality of nozzles, each nozzle being coupled to one of the plurality of horizontal manifolds;

wherein and each nozzle has a nozzle output that is oriented toward the processing volume of the processing chamber, each nozzle only oriented toward the processing volume having a direction that is substantially perpendicular to the chamber wall;

wherein the outer surface of the plenum that facing the processing volume is substantially planar and curved and includes each of nozzle outputs.

12. The processing chamber of claim 10, wherein the plurality of nozzles are defined as either discrete nozzles or as a slit nozzle.

13. The processing chamber of claim 10, wherein said plenum is integral with said chamber wall.

14. The processing chamber of claim 10, wherein said set of manifolds is disposed within said chamber wall.

15. The processing chamber of claim 10, wherein the nozzle outputs are disposed flush with an interior-facing surface of said chamber wall.

* * * * *